(12) United States Patent
Esteve et al.

(10) Patent No.: US 11,901,407 B2
(45) Date of Patent: Feb. 13, 2024

(54) SEMICONDUCTOR DEVICE WITH IMPROVED JUNCTION TERMINATION EXTENSION REGION

(71) Applicant: NEXPERIA B.V., Nijmegen (NL)

(72) Inventors: Romain Esteve, Nijmegen (NL); Tim Böttcher, Nijmegen (NL)

(73) Assignee: Nexperia B.V, Nijmegen (NL)

( * ) Notice: Subject to any disclaimer, the term of this patent is extended or adjusted under 35 U.S.C. 154(b) by 155 days.

(21) Appl. No.: 17/484,813

(22) Filed: Sep. 24, 2021

(65) Prior Publication Data
US 2022/0102486 A1   Mar. 31, 2022

(30) Foreign Application Priority Data

Sep. 28, 2020   (EP) .................................... 20198734

(51) Int. Cl.
*H01L 29/06* (2006.01)
*H01L 29/16* (2006.01)
*H01L 29/20* (2006.01)

(52) U.S. Cl.
CPC .......... *H01L 29/0623* (2013.01); *H01L 29/16* (2013.01); *H01L 29/1608* (2013.01); *H01L 29/20* (2013.01); *H01L 29/2003* (2013.01)

(58) Field of Classification Search
CPC . H01L 29/0623; H01L 29/16; H01L 29/1608; H01L 29/20; H01L 29/2003; H01L 29/0615; H01L 29/868; H01L 29/0619; H01L 29/0692; H01L 29/8611; H01L 29/872
See application file for complete search history.

(56) References Cited

U.S. PATENT DOCUMENTS 9,412,807 B1 *   8/2016   Huang ................ H01L 29/8611
11,094,779 B2 *  8/2021   Brandt ................ H01L 21/2253
(Continued)

FOREIGN PATENT DOCUMENTS

JP   2012199434 A   10/2012

OTHER PUBLICATIONS

Extended European Search Report for corresponding European application EP20198734.4, 8 pages, dated Mar. 18, 2021.

*Primary Examiner* — Shahed Ahmed
*Assistant Examiner* — Khatib A Rahman
(74) *Attorney, Agent, or Firm* — Ruggiero, McAllister & McMahon LLC

(57) ABSTRACT

A semiconductor device having an improved junction termination extension region is provided. The disclosure particularly relates to diodes having such an improved junction termination extension. The semiconductor device includes an active area extending in a first direction, and a junction termination extension, 'JTE', region of a first charge type surrounding the active area. The JTE region includes a plurality of field relief sub-regions that each surround the active area and that are mutually spaced apart in a direction perpendicular to a circumference of the active area. The plurality of field relief sub-regions includes a first group of field relief sub-regions, and for each field relief sub-region of the first group, a plurality of field relief elements of a second charge type is provided therein, which field relief elements are mutually spaced apart in a circumferential direction with respect to the active area.

20 Claims, 10 Drawing Sheets

(56) References Cited

U.S. PATENT DOCUMENTS

| | | | |
|---|---|---|---|
| 2011/0220913 A1 | 9/2011 | Hatakeyama | |
| 2014/0021489 A1 | 1/2014 | Hamada et al. | |
| 2015/0340443 A1* | 11/2015 | Wada | H01L 29/0688 257/77 |
| 2016/0307997 A1 | 10/2016 | Arthur et al. | |
| 2019/0006513 A1* | 1/2019 | Ouvrard | H01L 29/7397 |
| 2019/0035884 A1* | 1/2019 | Bauer | H01L 29/0619 |
| 2020/0091298 A1* | 3/2020 | Hori | H01L 29/868 |
| 2020/0203487 A1* | 6/2020 | Arthur | H01L 29/0634 |
| 2020/0395439 A1* | 12/2020 | Matsuno | H01L 29/6606 |
| 2021/0098568 A1* | 4/2021 | Lichtenwalner | H01L 29/0623 |
| 2021/0273090 A1* | 9/2021 | Steinmann | H01L 29/7811 |

* cited by examiner

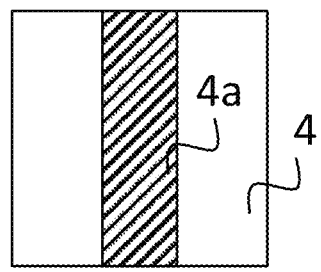
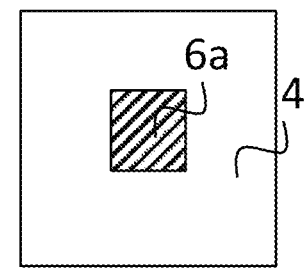
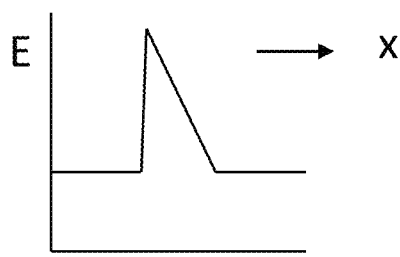
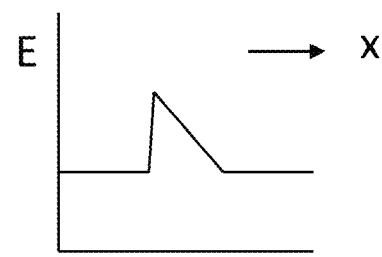
Figure 9A
Figure 9B
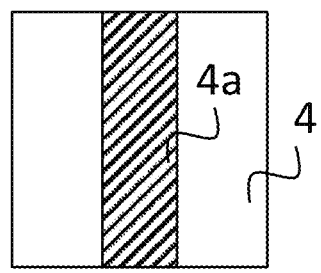
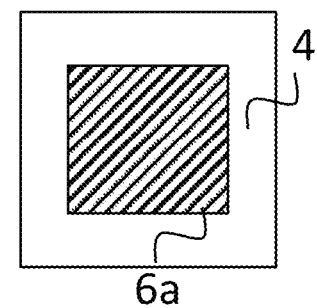
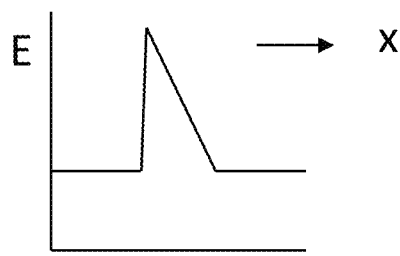
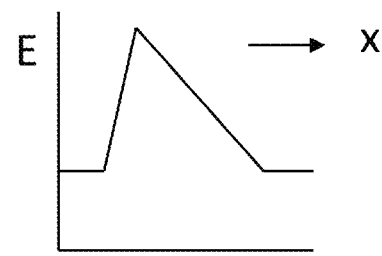
Figure 9C
Figure 9D

SEMICONDUCTOR DEVICE WITH IMPROVED JUNCTION TERMINATION EXTENSION REGION

CROSS REFERENCE TO RELATED APPLICATION

This application claims the benefit under 35 U.S.C. § 119(a) of European Application No. 20198734.4 filed Sep. 28, 2020, the contents of which are incorporated by reference herein in their entirety.

BACKGROUND OF THE DISCLOSURE

1. Field of the Disclosure

The present disclosure relates to a semiconductor device having an improved junction termination extension region. The present disclosure particularly relates to diodes having such an improved junction termination extension.

2. Description of the Related Art

Wide-bandgap materials such as silicon carbide, SiC, and gallium nitride, GaN, have been used for realizing semiconductor devices operating at high voltages. Due to their large bandgap, these material systems have a high critical electrical field allowing them to be operated at higher voltages without suffering from breakdown phenomena such as avalanche breakdown.

However, despite the high theoretical breakdown voltages, practical devices display breakdown voltages that may be significantly lower than those based on the critical electrical field. These deviations may be attributed to field crowding at the edges of the device.

Various solutions are known to mitigate the effects associated with field crowding. A known solution is shown in FIGS. 1A and 1B. In FIG. 1A, a top-view of a general semiconductor device 10 is shown, and FIG. 1B illustrates a side-view of a cross-section along line a-a' of semiconductor device 10. Semiconductor device 10 has an active area 1 extending in a first direction in between a frontside metal contact 2 and a backside metal contact 3. The device further comprises a junction termination extension, 'JTE', region 4 of a first charge type surrounding active area 1, wherein JTE region 4 comprises a plurality of field relief sub-regions that each surround active area 1 and that are mutually spaced apart in a direction perpendicular to a circumference of active area 1.

In each field relief sub-region, a field relief ring 4a-4c of a second charge type is provided that surrounds active area 1. Moreover, the distance between adjacent rings 4a-4c and a width of rings 4a-4c increases in a direction away from active area 1.

It will be appreciated by a skilled person that a region of a first or second charge type corresponds to a region that is predominantly doped with dopants of a first or second type, respectively. Dopants of the first type may correspond to one of p-type and n-type dopants, and dopants of the second type may correspond to another of p-type and n-type dopants.

Field relief rings 4a-4c help to spread the electrical field to prevent excessive electrical field crowding. The doping concentrations of field relief rings 4a-4c and the doping concentration of JTE region 4 should be such that close to the breakdown voltage, the entire JTE region 4 is depleted.

FIG. 8 schematically illustrates the electric field inside JTE region 4 of the semiconductor device of FIG. 1A. In the top figure, JTE region 4 is indicated in which field relief rings 4a-4c are provided. The figure at the bottom, illustrates how the electrical field peaks inside field relief rings 4a-4c as a function of a distance x from active area 1. By allowing the electrical field to peak inside field relief rings 4a-4c, it becomes possible to more efficiently spread the electrical field over JTE region 4. Field crowding can be prevented even more by using more rings.

The Applicant has found that devices using the above-mentioned JTE region in combination with field relief rings are susceptible to process variations. More in particular, the Applicant has found that the width of the innermost field relief rings is typically very small. Slight changes in the definition of these rings, for example due to lithography tolerances, have a severe impact on the breakdown voltage of the device.

SUMMARY

It is an object of the present disclosure to provide a semiconductor device having a JTE in which the abovementioned problem does not occur or at least to a lesser extent.

According to the disclosure, this object is achieved using a semiconductor device in which the plurality of field relief sub-regions comprises a first group of field relief sub-regions, wherein for each field relief sub-region of the first group, a plurality of field relief elements of a second charge type is provided therein, which field relief elements are mutually spaced apart in a circumferential direction with respect to the active area.

Typically, the field relief elements are designed in terms of dopant concentration and/or width in a direction perpendicular to a circumference of the active area such that the electric field during reverse operation does not exceed a predefined value. For the innermost field relief rings of the prior art, this results in very narrow innermost rings. The Applicant has found that by using separate field relief elements along the circumferential direction with respect to the active area instead of closed rings, the width of the field relief elements can be chosen to be greater without causing the electric field to exceed the predefined value. Such wider elements are less susceptible to process tolerances.

With a field relief ring of the second charge type arranged inside the JTE region of the first charge type, two PN junctions can be identified in a plane parallel to the semiconductor substrate. Accordingly, majority charge carriers inside the field relief ring can diffuse to the JTE region from two opposing directions. On the other hand, with a field relief element of the present disclosure, four PN junctions can be identified in the plane parallel to the semiconductor substrate. In other words, majority charge carriers inside the field relief element can diffuse to the JTE region from more directions with respect to majority carriers inside a field relief ring. Consequently, the depletion region formed in the JTE region due to majority carrier diffusion to and from the field relief element along a given side of the field relief element will be less than that for the known field relief rings. By using a wider field relief element, the device becomes less susceptible to process tolerances.

The semiconductor device may further comprise a backside metal layer, and a frontside metal layer spaced apart from the backside metal layer in the first direction, wherein the active area is arranged in between the backside metal layer and the frontside metal layer.

The plurality of field relief sub-regions may comprise a second group of field relief sub-regions, wherein for each field relief sub-region of the second group, a field relief ring of the second charge type surrounding the active area is provided therein. The field relief sub-regions of the first and second group may be arranged alternately. However, it is preferred to use a field relief sub-region of the first group as the innermost field relief sub-region relative to the active area.

With respect to the direction perpendicular to a circumference of the active area, a width of the field relief elements and, if applicable, a width of the field relief rings may increase with a distance when moving away from the active area. Additionally, with respect to the direction perpendicular to a circumference of the active area, a dopant concentration of the field relief elements and, if applicable, a dopant concentration of the field relief rings may increase when moving away from the active area. Additionally, or alternatively, with respect to the direction perpendicular to a circumference of the active area, a dopant concentration of the JTE region may decrease when moving away from the active area. Additionally, or alternatively, with respect to said direction perpendicular to a circumference of the active area, a spacing between adjacent field relief sub-regions may increase when moving away from active area. Additionally, or alternatively, with respect to said direction perpendicular to a circumference of the active area, a length of the plurality of field relief elements along said circumferential direction may increase when moving away from the active area. The abovementioned measures all result in an increase of dopants of the second type, e.g. n-type dopants, relative to the dopants of the first type, e.g. p-type dopants. The Applicant has found that this results in a relatively constant electrical field near the first surface of the JTE region throughout the JTE region, Moreover, the maximum electrical field inside the field relief elements or rings can be substantially the same. These effects can be achieved by increasing the width and/or length of the field relief elements, by lowering the dopant concentration of the JTE region, and/or by increasing the dopant concentration of the field relief elements, all when moving away from the active area.

Additionally, or alternatively, for at least one field relief sub-region of the first group, all the field relief elements thereof are equidistant from the circumference of the active area. Additionally, or alternatively, each segment of a field relief ring, if applicable, can be equidistant from the circumference of the active area. Preferably, the field relief ring has an identical shape as a circumference of the active area in a plane perpendicular to the first direction.

The plurality of field relief elements of adjacent field relief sub-regions of the first group can be arranged in a staggered pattern. For example, when denoting k field relief sub-regions as R0 . . . Rk, with R0 being the innermost field relief sub-region relative to the active area, the field relief elements of Rn (n=0 . . . k−1) may each have a center position along the circumferential direction that corresponds to the position along the circumferential direction in the middle of the center positions of two adjacent field relief elements in Rn+1. Moreover, a spacing between adjacent field relief elements in a field relief sub-region of the first group can be greater than or equal to a length along the circumferential direction of the field relief elements in an adjacent field relief sub-region of the first group. For example, a separation in the circumferential direction between two adjacent field relief elements in Rn can be greater than a length of the field relief elements in Rn+1.

The JTE region may have a first surface and a second surface, wherein the plurality of field relief elements and, when applicable, the field relief ring(s) extend at least partially inside the JTE region in the first direction between the first surface and the second surface. In particular embodiments, the plurality of field relief elements and, when applicable, the field relief ring(s), may extend from the first surface towards the second surface. More in particular, the field relief elements and ring(s) may lie substantially in line with the first surface. In further embodiments, the plurality of field relief elements and, when applicable, the field relief ring(s), extend in the first direction fully through the JTE region from the first surface to the second surface. In the above, among the first and second surface, the first surface is arranged closer to the frontside metal layer.

For at least one field relief sub-region of the first group, at least some of the field relief elements can be connected using one or more interconnect elements of the second charge type, wherein, with respect to said direction perpendicular to a circumference of the active area, a width of each of the plurality of interconnect elements in a same field relief sub-region of the first group is smaller than a width of the field relief elements of that field relief sub-region. In some embodiments, each field relief element in a field relief sub-region of the first group is connected to an adjacent field relief element, preferably resulting in a ring-like structure.

The width of each of the plurality of interconnect elements in each of the plurality of field relief sub-regions of the first group can be substantially identical.

In the above, the first charge type may correspond to an p-type doping, and the second charge type to a n-type doping, or vice versa.

The active area may comprise a first region of the first charge type attached to or electrically connected to the frontside metal layer, and a second region of the second charge type adjacent in the first direction to the first region and attached to or electrically connected to the backside metal layer. In this case, the JTE region may surround the first region of the active area, the frontside metal layer may provide an Ohmic contact to the first region and the backside metal layer an Ohmic contact to the second region. In this manner a semiconductor device with a PN junction is formed, such as a PN diode. The semiconductor device may further comprise an intrinsically doped region in between the first region and the second region. In this manner a PiN diode may be formed. Furthermore, the first region may comprise a highly doped sub-region of the first charge type having a higher dopant concentration than a remainder of the first region. In this manner a low-resistance Ohmic contact can be obtained. For the PN diode or PiN diode, the dopant concentration in the first region is higher than that of the JTE region, and the dopant concentration of the field relief elements and field relief rings, if any, is higher than that of the JTE region.

Alternatively, the active area may comprise a first region of the second charge type attached to or electrically connected to the frontside metal layer, and a second region of the second charge type adjacent in the first direction to the first region and attached to or electrically connected to the backside metal. In this case, the JTE region may surround the first region of the active area, the frontside metal layer may provide a Schottky contact to the first region and the backside metal layer may provide an Ohmic contact to the second region. In this manner a semiconductor device with a Schottky junction is formed, such as a Schottky diode. In addition, the semiconductor device may further comprise a third region of the first charge type arranged in between the JTE region and the first region, wherein the frontside metal layer provides an Ohmic contact to third region. In this manner, a semiconductor device with a merged PN junction is formed, such as a MPS diode. The third region may comprise a highly doped sub-region of the first charge type having a higher dopant concentration than a remainder of the third region. In this manner, a low-resistance Ohmic contact can be obtained. For the Schottky diode or MPS diode, the dopant concentration in the first region is higher than that of the JTE region, and the dopant concentration of the field relief elements and field relief rings, if any, is higher than that of the JTE region.

Note that, although reference is made above to various diode structures, that is, a P(i)N diode, a Schottky diode and an MPS diode, the present disclosure is not limited to such diode structures. In particular, the present disclosure may similarly apply to various other semiconductor devices, such as a bipolar junction transistor, 'BJT', a field-effect transistor, 'FET', a junction gate field-effect transistor, 'JFET', an insulated gate bipolar transistor, 'IGBT', and the like. In each of these semiconductor devices, the implementation of the JTE region and the field relief elements according to the present disclosure can increase the breakdown voltage of said semiconductor devices while relaxing the dependency on process tolerances for said field relief elements.

The present disclosure is suitable to be implemented in various semiconductor technologies such as silicon 'Si', silicon carbide, 'SiC', gallium nitride, 'GaN', or gallium arsenide, 'GaAs'.

The plurality of field relief elements may have one of a polygonal shape, such as a rectangular shape, or an elliptical shape, such as a circular shape. Additionally, or alternatively, the field relief elements may have a chamfered polygonal shape. The elliptically or circularly shaped field relief elements are preferred, because less field crowding occurs with respect to polygonally shaped field relief elements due to the absence of corners. Additionally, or alternatively, each field relief element in a same field relief sub-region of the first group may have the same shape and/or size. Additionally, or alternatively, the field relief elements of all field relief sub-regions of the first group may have the same shape.

BRIEF DESCRIPTION OF THE DRAWINGS

Next, the present disclosure will be described referring to the appended drawings, wherein:

FIGS. 9A, 9C schematically illustrate the electric field inside a known field relief ring, whereas FIGS. 9B, 9D schematically illustrate the electric field inside a field relief element of the present disclosure.

Hereinafter, reference will be made to the appended drawings. It should be noted that identical reference signs may be used to refer to identical or similar components.

DETAILED DESCRIPTION

Figure 2A:
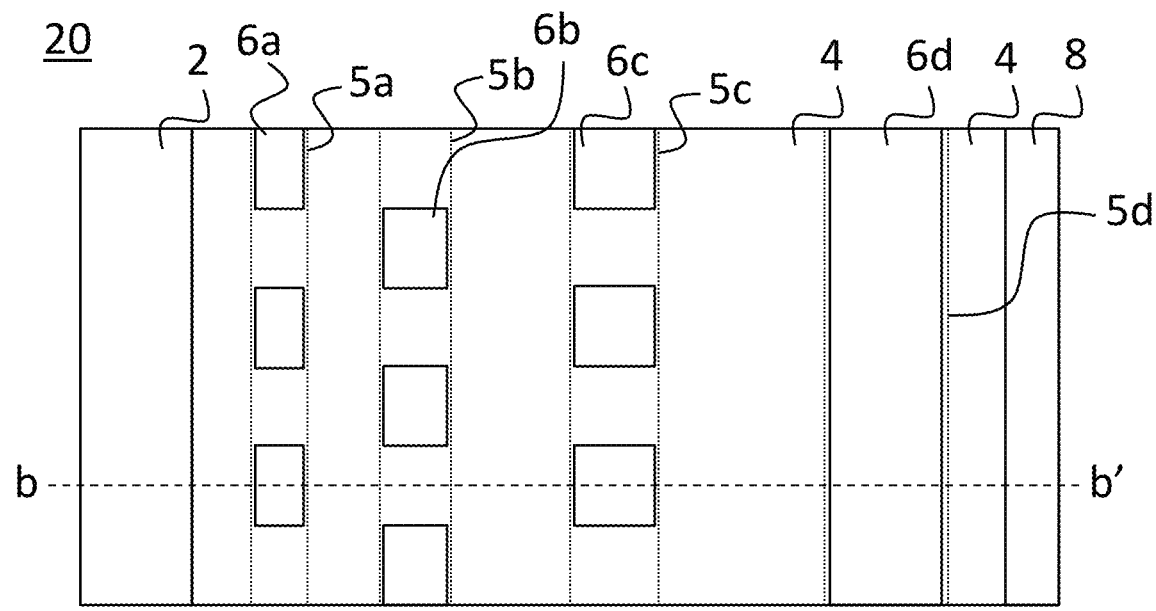
FIGS. 2A-2D illustrate partial top views of different embodiments of an MPS diode in accordance with the present disclosure.

FIG. 2A illustrates a possible top view of a part of a semiconductor device 20 in which JTE region 4 is shown in detail. Semiconductor device 20 may be, for example, a silicon carbide MPS diode.

The JTE region 4, which surrounds an active area present below frontside metal 2, is of a first charge type and comprises a plurality of field relief sub-regions 5a-5d.

A plurality of field relief elements 6a-6c is provided inside the field relief sub-regions 5a-5c of the first group, respectively. Each of the plurality of field relief elements 6a-6c is of a second charge type, and is shown in FIG. 2A as having a rectangular shape.

Furthermore, a field relief ring 6d is provided inside field relief sub-region 5d of the second group. Similarly to the field relief elements 6a-6c, field relief ring 6d is of the second charge type.

The first charge type corresponds to one of an n-type doping and a p-type doping, while the second charge type corresponds to the other of an n-type doping and a p-type doping. In other words, the second charge type is always opposite to that of the first charge type.

Since JTE region 4 is of a charge type that is different from that of field relief elements 6a-6c and field relief ring 6d, a PN junction is formed between JTE region 4 and field relief elements 6a-6c as well as between JTE region 4 and field relief ring 6d due to the diffusion of the majority carriers in the respective regions. This is illustrated in more detail for a single field relief ring 4a in FIGS. 9A-9D. Here, FIGS. 9A (bottom) and 9C (bottom) schematically illustrate the electrical field for a known single field relief ring 4a. On the other hand, FIGS. 9B (bottom) and 9D (bottom) schematically illustrate the electrical field for a single field relief element 6a of the present disclosure.

Figure 1A:
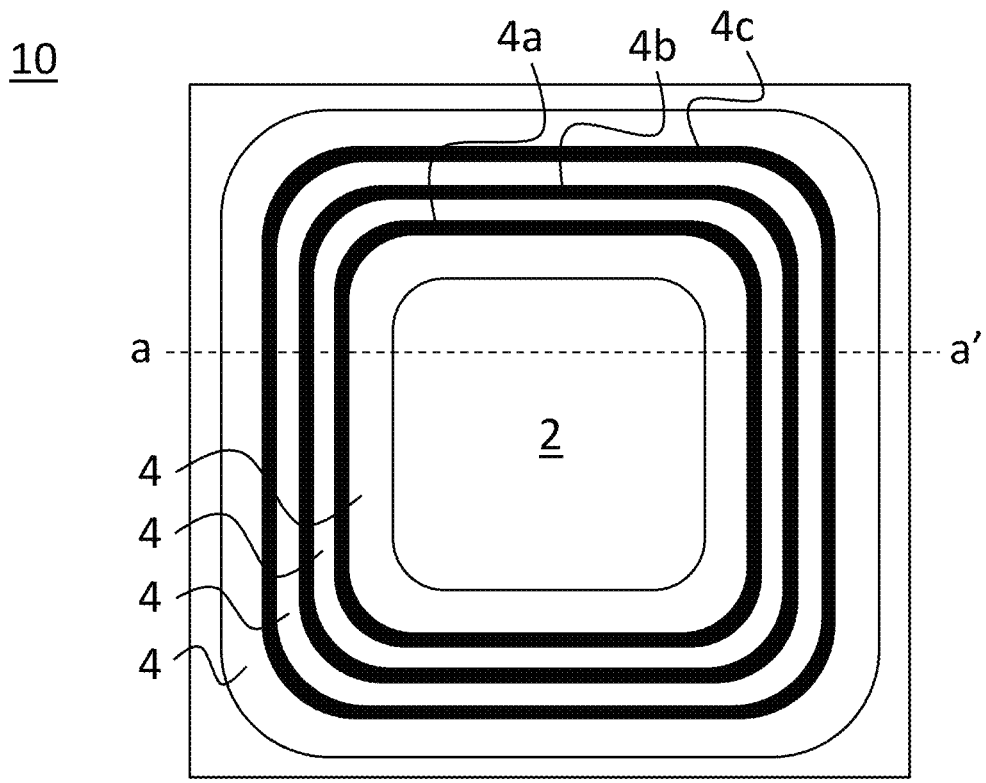
FIG. 1A illustrates a top-view of a known semiconductor device with a JTE region with field relief rings.
Figure 1B:
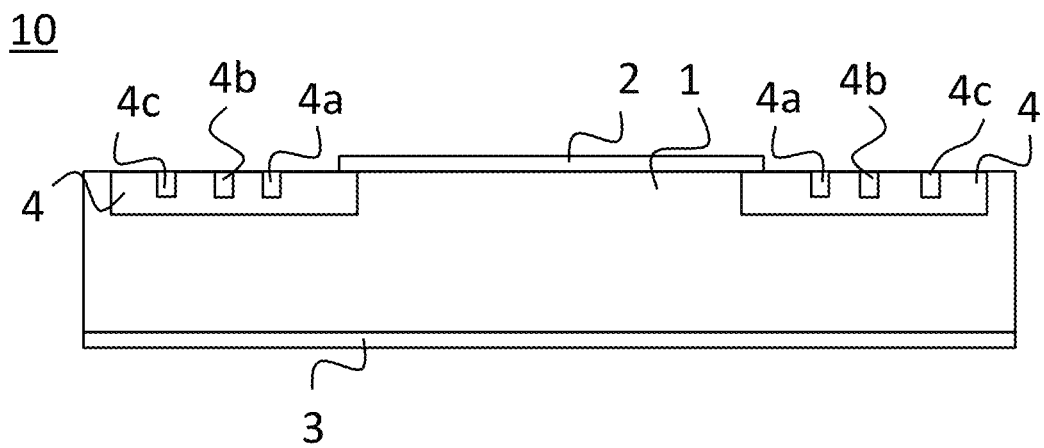
FIG. 1B illustrates a full cross-sectional view of the known semiconductor device of FIG. 1A.

Compared to known field ring 4a that is used in semiconductor device 10 of FIGS. 1A and 1B, the number of directions from which majority carriers inside field relief element 6a can diffuse to JTE region 4 is increased. The Applicant has found that as a result of this increase, the maximum electrical field inside field relief 6a is lower than inside field relief ring 4a for similar dopant concentrations. The Applicant then concluded that the width of field relief elements 6a-6c can be greater than that of field relief rings 4a-4c while still displaying the same maximum electrical field inside the rings or elements. This is illustrated in FIGS. 9C and 9D. By using wider field relief elements 6a-6c, the device becomes less susceptible to process tolerances.

As shown in FIG. 2A, field relief elements 6a-6c in respective field relief sub-regions 5a-5c may increase in width along a direction perpendicular to a circumference of the active area when moving away from the active area. It is therefore advantageous to implement field relief sub-region 5a nearest to the active area as a field relief sub-region of the first group, e.g. containing field relief elements 6a, such that the effects of process tolerances on the performance of semiconductor device 20 are significantly reduced.

It will be appreciated by a skilled person that, although four field relief sub-regions 5a-5d are shown, the present disclosure is not limited to having four field relief sub-regions. The number of field relief sub-regions, and more in particular the number of field relief sub-regions of the first group and/or the second group, can be changed such that, for example, semiconductor device 20 has a JTE region with one or more field relief sub-regions of the first group, and does not have any field relief sub-regions of the second group at all.

Figure 2B:
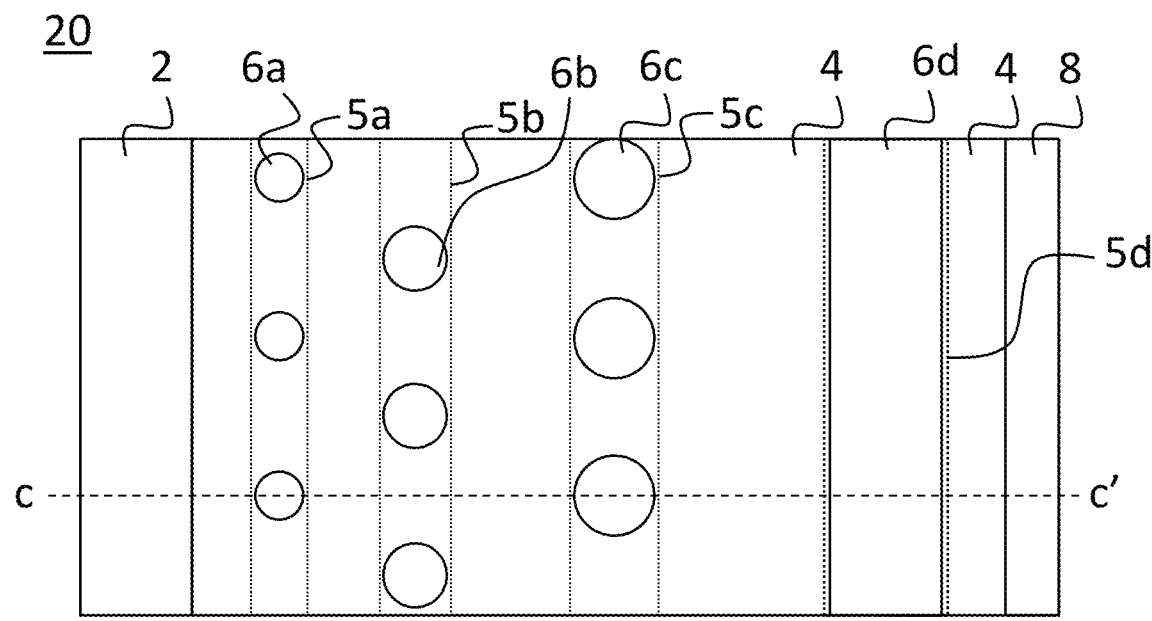

FIG. 2B illustrates another possible top view of a part of semiconductor device 20. The top view of FIG. 2B differs from that of FIG. 2A in that each of the plurality of field relief elements 6a-6c has a circular shape when viewed from a top view. In particular, since field relief elements 6a-6c in FIG. 2B have a circular shape, when moving away from the active area, said field relief elements 6a-6c increase in diameter along a direction perpendicular to the circumference of the active area.

Although FIGS. 2A and 2B show the field relief elements 6a-6c to be exclusively rectangular or circular, the present disclosure is not limited thereto. For example, within a JTE region, a first field relief sub-region may have field relief elements having a rectangular shape, while a second field relief sub-region has field relief elements having a circular shape. Furthermore, various shapes of field relief elements may be used within a same field relief sub-region.

Figure 2C:
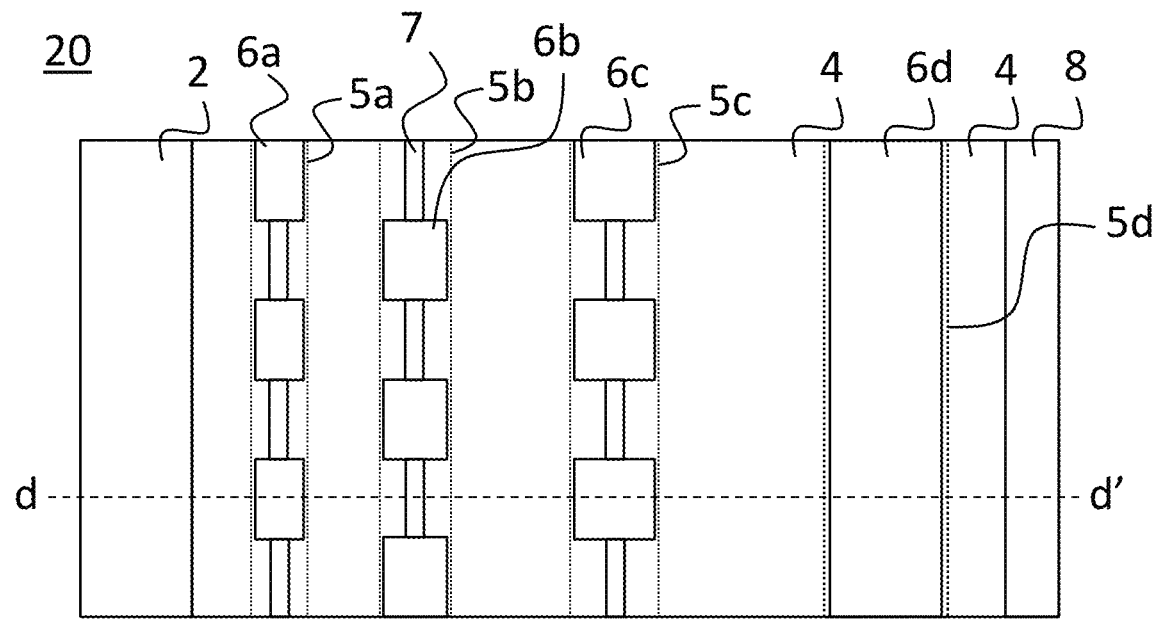

FIG. 2C illustrates a third possible top view of a part of semiconductor device 20. The top view of FIG. 2C differs from that of FIG. 2A in that adjacent field relief elements 6a-6c within field relief sub-regions 5a-5c, respectively, are connected to each other via an interconnect element 7 of the second charge type. The width of interconnect element 7, along a direction perpendicular to a circumference of the active area, is less than a width of field relief elements 6a-6c along the same direction. More in particular, the width of each interconnect element 7 among interconnect elements 7 provided in field relief sub-regions 5a-5c are identical.

Since the width of interconnect elements 7 is less than the width of field relief elements 6a-6c, interconnect elements 7 of the second charge type can form a PN junction with JTE region 4 through majority carrier diffusion while still partly allowing the majority carriers in field relief elements 6a-6c to diffuse in more directions than field relief rings 4a-4c of semiconductor device 10 shown in FIGS. 1A and 1B. In other words, due to the relatively small width of interconnect elements 7 with respect to field relief elements 6a-6c, interconnect elements 7 also serve the purpose of field relief while minimally impacting the field relief of field relief elements 6a-6c.

Figure 2D:
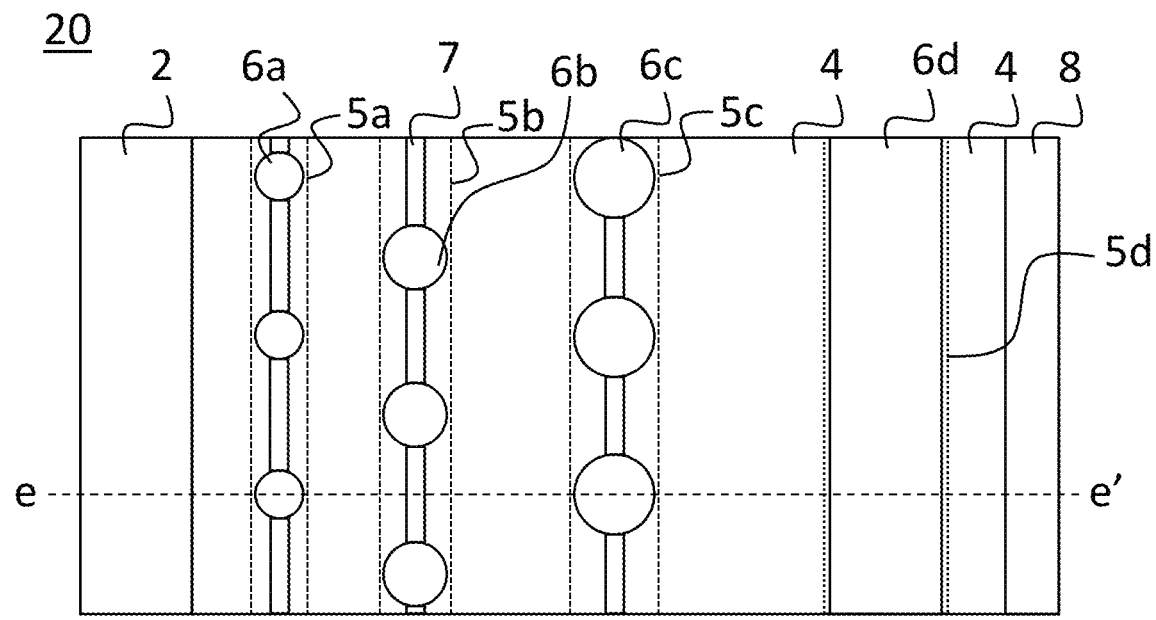

FIG. 2D illustrates a third possible top view of a part of semiconductor device 20. The top view of FIG. 2D differs from that of FIG. 2B in that, similarly to FIG. 2C, adjacent field relief element 6a-6c within field relief sub-regions 5a-5c, respectively, are connected to each other via an interconnect element 7 of the second charge type.

Figure 3A:
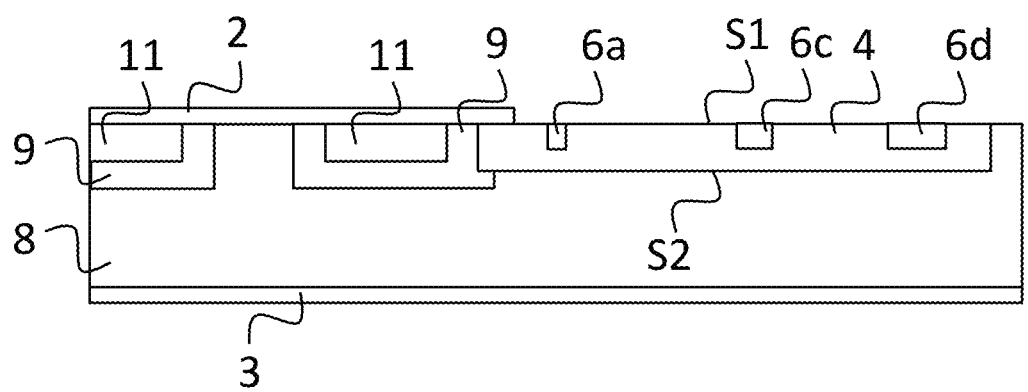
FIGS. 3A and 3B illustrate two different possible cross-sectional views corresponding to the MPS diode of FIG. 2A or 2B.

FIG. 3A shows an exemplary partial cross-sectional view of a semiconductor device 20. In particular, semiconductor device 20 as seen in FIG. 3A is commonly referred to as an MPS diode. The partial cross-sectional view shown in FIG. 3A corresponds to a side view of semiconductor device 20 at a position corresponding to either of line segment b-b' shown in FIG. 2A and line segment c-c' shown in FIG. 2B.

Semiconductor device 20 comprises a drift layer 8 of the second charge type arranged below frontside metal layer 2, an island region 9 of the first charge type surrounding a region of drift layer 8, and JTE region 4 surrounding island region 9. Backside metal layer 3 may be attached to drift layer 8.

Frontside metal layer 2 forms a Schottky contact with drift layer 8, thereby forming a Schottky diode-type operation between frontside metal layer 2 and backside metal layer 3. In addition, due to a diffusion of majority carriers between island region 9 and drift layer 8, a depletion region is formed in drift layer 8 and island region 9. The width of the depletion region formed in drift layer 8 depends on the reverse bias.

Optionally, island region 9 may have a highly doped region 11 of the first charge type provided therein, wherein the dopant concentration of highly doped region 11 is greater than a dopant concentration of island region 9. Highly doped region 11 may achieve a low resistance Ohmic contact with frontside metal layer 2.

In the cross-sectional view of FIG. 3A, field relief elements 6a and 6c are shown, as well as field relief ring 6d. However, since the cross-section is taken at a position corresponding to line segment b-b' in FIG. 2A or line segment c-c' in FIG. 2B, field relief elements 6b are not visible in this particular cross-sectional view.

As shown in FIG. 3A, field relief elements 6a-6c and field relief ring 6d extend only partially into JTE region 4 from a first surface S1 of JTE region 4. In this configuration, diffusion of majority carriers between field relief elements 6a-6c and field relief ring 6d and JTE region 4 takes place not only from lateral directions, as described with reference to FIGS. 2A-2D, but also from a vertical direction.

Figure 3B:
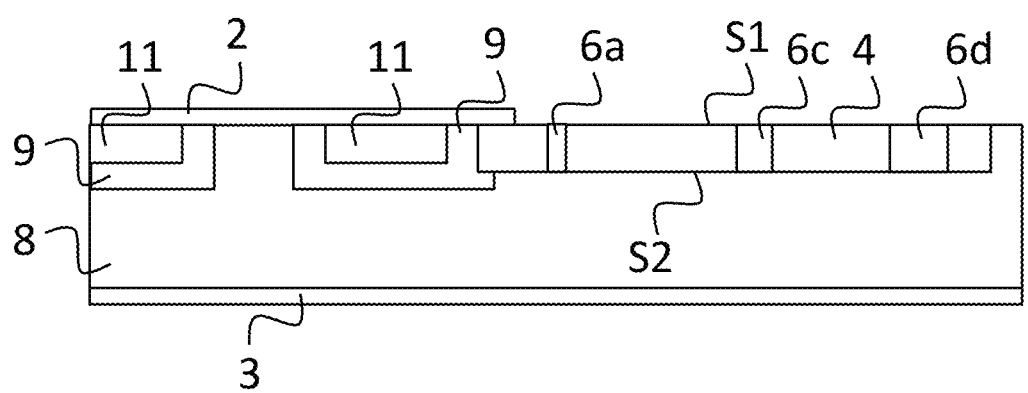

FIG. 3B shows another example of a partial cross-sectional view of semiconductor device 20, which is again a side view of semiconductor device 20 at a position corresponding to either of line segment b-b' shown in FIG. 2A and line segment c-c' shown in FIG. 2B.

The configuration shown in FIG. 3B differs from that of FIG. 3A in that field relief elements 6a-6c and field relief ring 6d extend fully through JTE region 4 from first surface S1 of JTE region 4 to a second surface S2 of JTE region 4, thereby contacting drift layer 8.

Figure 4A:
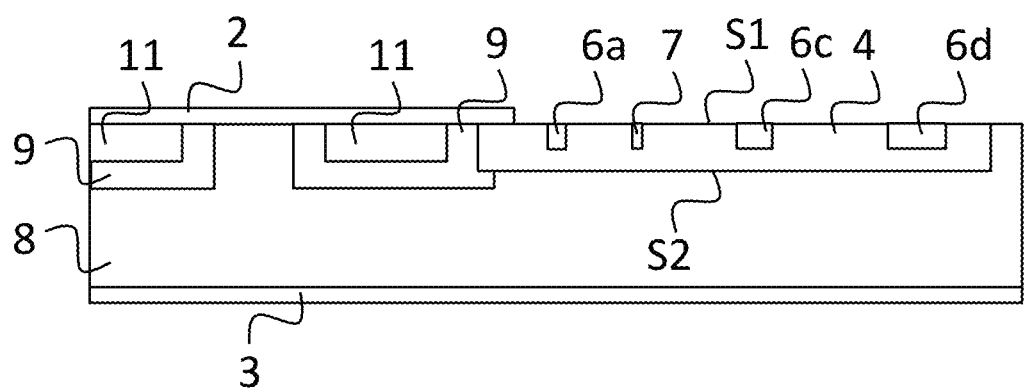
FIGS. 4A and 4B illustrate two different possible cross-sectional views corresponding to the MPS diode of FIG. 2C or 2D.
Figure 4B:
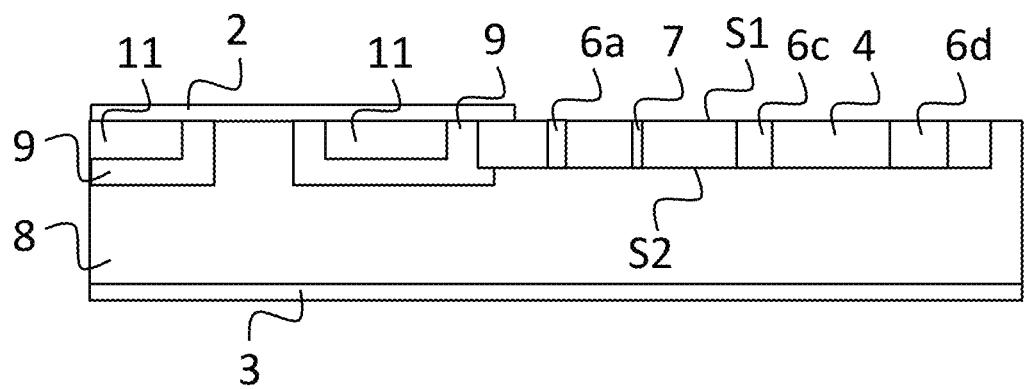

FIGS. 4A and 4B show two examples of a partial cross-sectional view of semiconductor device 20. The partial cross-sectional view shown in FIGS. 4A and 4B correspond to a side view of semiconductor device 20 at a position corresponding to either of line segment d-d' shown in FIG. 2C and line segment e-e' shown in FIG. 2D.

The configurations shown in FIGS. 4A and 4B differ from that of FIGS. 3A and 3B, respectively, in that interconnect element 7 of FIGS. 2C and 2D are seen in the cross-sectional view. For example, in FIG. 4A, interconnect element 7 is arranged in between field relief elements 6a and 6c in a lateral direction and extends only partially into JTE region 4 from first surface S1 of JTE region 4. On the other hand, in FIG. 4B, interconnect element 7 extends fully through JTE region 4 from first surface S1 to second surface S2.

Figure 5:
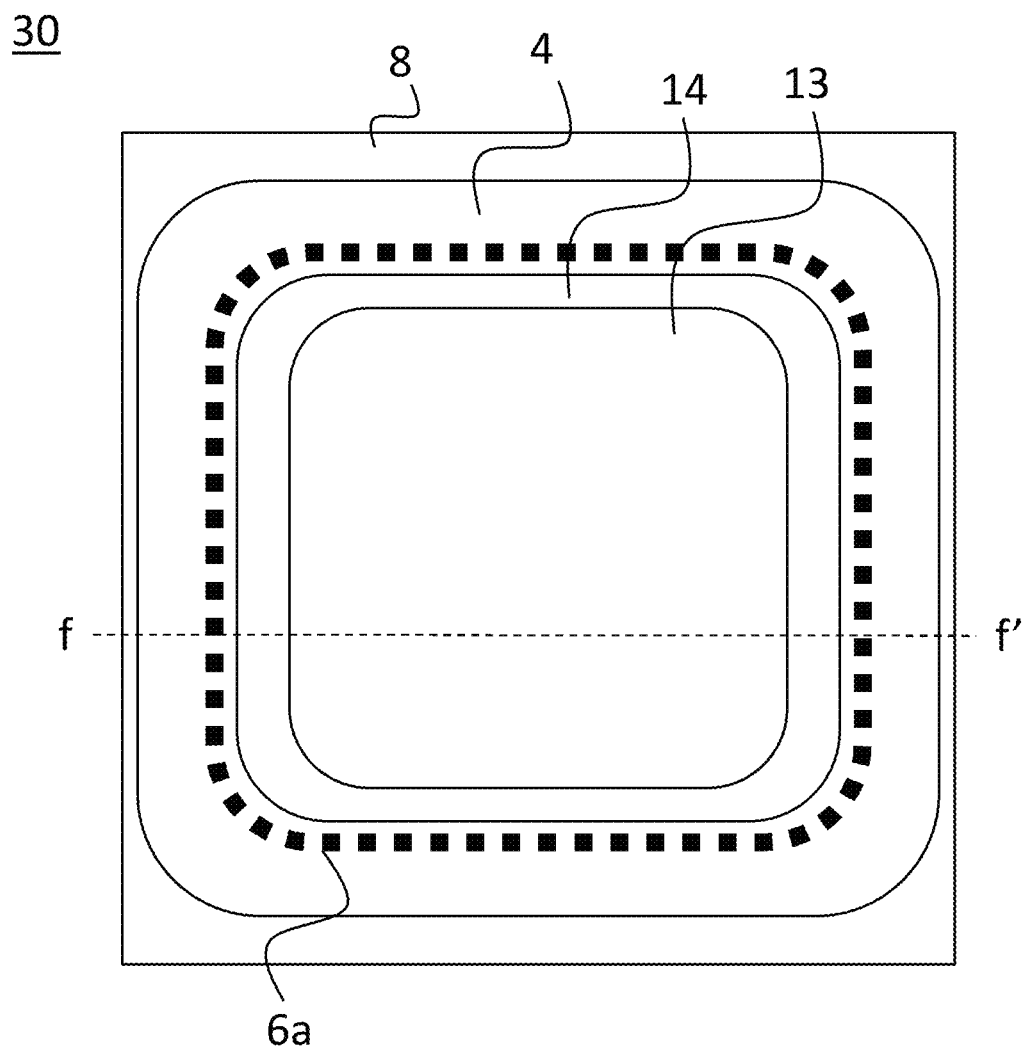
FIG. 5 illustrates a full top view of an MPS diode in accordance with the present disclosure.

FIG. 5 shows a top view of a semiconductor device 30, wherein semiconductor device 30 is a SiC MPS diode. In FIG. 5, a power metal layer 13, a liner metal layer 14 provided below power metal layer 13, JTE region 4 surrounding an active area below liner metal layer 14, and a drift layer 8 of the second charge type are shown. For clarity purposes, only one field relief sub-region having field relief elements 6a is shown.

Figure 6:
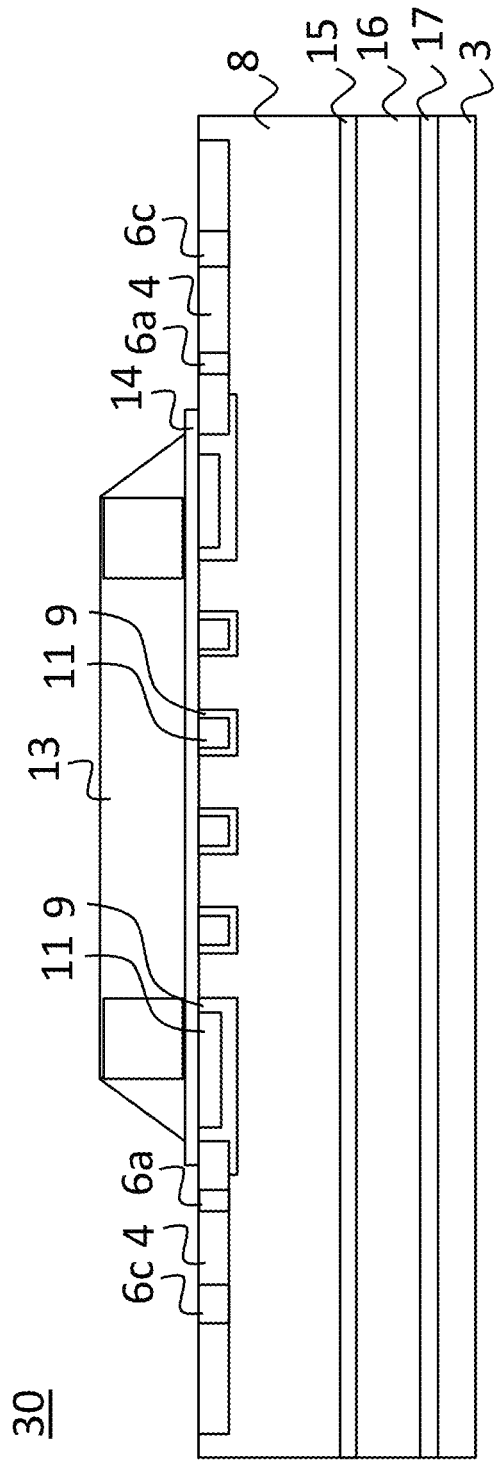
FIG. 6 illustrates a full cross-sectional view of the MPS diode of FIG. 5.

FIG. 6 shows a full cross-sectional view of semiconductor device 30. The cross-sectional view shown in FIG. 6 corresponds to a side view of semiconductor device 30 at a position corresponding to line segment f-f' shown in FIG. 5. Semiconductor device 30 comprises a backside metal layer 3, and an Ohmic contact 17 to n-doped SiC substrate 16 using a suitable metal layer stack as known in the art. An n-doped SiC buffer layer 15 is epitaxially grown on SiC substrate 16. On top of buffer layer 15, a SiC n-doped drift layer 8 is provided.

Inside drift layer 8, a p-doped JTE region 4 is formed in which n-doped field elements 6a-6c are provided as described above. In addition, p-doped island regions 9 are provided inside and surrounding a region of drift layer 8. In island regions 9, highly p-doped regions 11 are formed that enable an Ohmic contact to a liner metal layer 14, which is achieved using a suitable metal layer stack as known in the art. This same metal layer forms a Schottky contact with drift layer 8. Finally, a power metal layer 13 is formed on top of liner metal layer 14. This power metal layer 13 provides a low Ohmic resistance and can be obtained using a suitable metal layer stack known in the art.

Typical dopant concentrations for JTE region 4 lie in the range $10^{16}$-$10^{18}$ cm$^{-3}$, whereas a dopant concentration of drift layer 8 typically lies in the range $10^{15}$-$10^{17}$ cm$^{-3}$.

Figure 7:
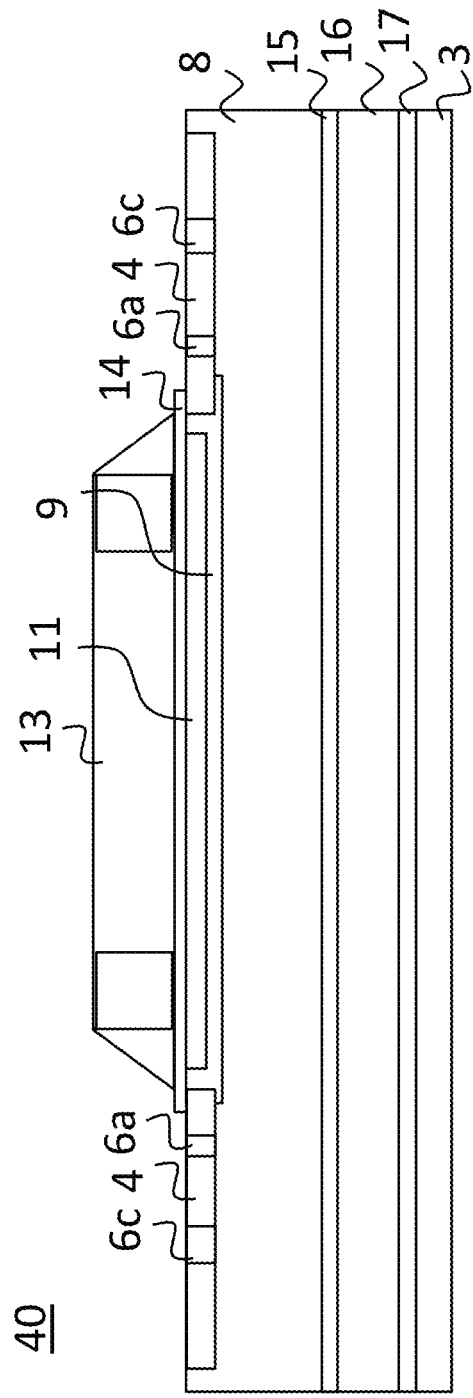
FIG. 7 illustrates a cross-sectional view of a PN diode in accordance with the present disclosure.
Figure 8:
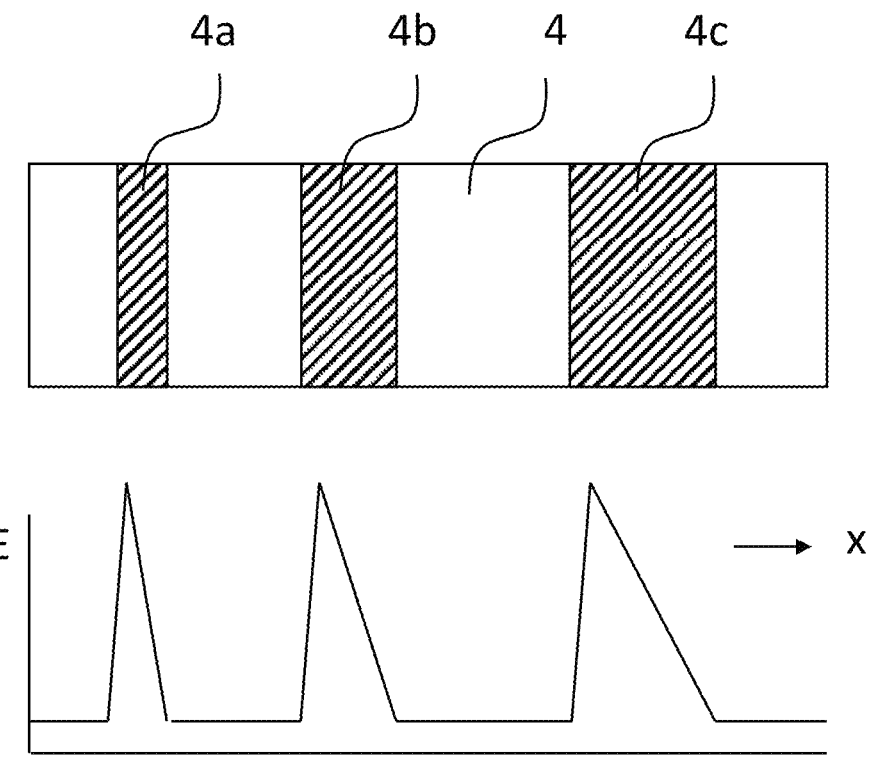
FIG. 8 schematically illustrates the electric field inside the JTE region of the semiconductor device of FIG. 1A.

FIG. 7 shows another example of a semiconductor device 40 with JTE region 4 according to the present disclosure. In FIG. 7, semiconductor device 40 is a SiC PN junction diode. Compared to the SiC Schottky diode of FIG. 6, it can be noted that p-doped island region 9 extends underneath liner metal layer 14.

Furthermore, a single highly p-doped region 11 is formed to enable a low-resistance Ohmic contact to liner metal layer 14. The design of JTE region 4 and field relief elements 6a-6c therein is identical to that of FIG. 6.

In the above, the present disclosure has been explained using detailed embodiments thereof. However, it should be appreciated that the disclosure is not limited to these embodiments and that various modifications are possible without deviating from the scope of the present disclosure as defined by the appended claims.

LIST OF REFERENCE NUMBERS

| | |
|---|---|
| 1 | active area |
| 2 | frontside metal layer |
| 3 | backside metal layer |
| 4 | junction termination extension, 'JTE', region |
| 4a-4c | field relief ring |
| 5a-5c | field relief sub-region |
| 6a-6c | field relief element |
| 6d | field relief ring |
| 7 | interconnect element |
| 8 | drift layer |
| 9 | island region |
| 10, 20, 30, 40 | semiconductor device |
| 11 | highly doped region |
| 13 | power metal layer |
| 14 | liner metal layer |
| 15 | buffer layer |
| 16 | substrate |
| 17 | ohmic contact |
| S1 | first surface JTE region |
| S2 | second surface JTE region |

What is claimed is:

1. A semiconductor device, comprising:
    an active area extending in a first direction;
    a junction termination extension (JTE) region of a first charge type surrounding the active area, wherein the JTE region comprises a plurality of field relief sub-regions that each surround the active area and that are mutually spaced apart in a direction perpendicular to a circumference of the active area;
    wherein the plurality of field relief sub-regions comprise a first group of field relief sub-regions;
    wherein for each field relief sub-region of the first group, a plurality of field relief elements of a second charge type is provided therein; and
    wherein the plurality of field relief elements are mutually spaced apart in a circumferential direction with respect to the active area.

2. The semiconductor device according to claim 1, further comprising a backside metal layer, and a frontside metal layer spaced apart from the backside metal layer in the first direction, wherein the active area is arranged in between the backside metal layer and the frontside metal layer.

3. The semiconductor device according to claim 1, wherein the plurality of field relief sub-regions comprises a second group of field relief sub-regions, wherein for each field relief sub-region of the second group, a field relief ring of the second charge type surrounding the active area is provided therein.

4. The semiconductor device according to claim 2, wherein the plurality of field relief sub-regions comprises a second group of field relief sub-regions, wherein for each field relief sub-region of the second group, a field relief ring of the second charge type surrounding the active area is provided therein.

5. The semiconductor device according to claim 1, wherein, with respect to the direction perpendicular to the circumference of the active area, a width of the field relief elements and a width of a plurality of field relief rings increases when moving away from the active area.

6. The semiconductor device according to claim 3, wherein, with respect to the direction perpendicular to the circumference of the active area, a width of the field relief elements and a width of the field relief rings increases when moving away from the active area.

7. The semiconductor device according to claim 5, wherein, with respect to the direction perpendicular to the circumference of the active area, a dopant concentration of the field relief elements and a dopant concentration of the field relief rings increases when moving away from the active area;
    wherein, with respect to the direction perpendicular to the circumference of the active area, a dopant concentration of the JTE region decreases when moving away from the active area;
    wherein, with respect to the direction perpendicular to the circumference of the active area, a spacing between adjacent field relief sub-regions increases when moving away from active area; and
    wherein, with respect to the direction perpendicular to the circumference of the active area, a length of the plurality of field relief elements along the circumferential direction increases when moving away from the active area.

8. The semiconductor device according to claim 6, wherein for at least one field relief sub-region of the first group, all the field relief elements thereof are equidistant from the circumference of the active area, and each segment of a field relief ring is equidistant from the circumference of the active area.

9. The semiconductor device according to claim 5, wherein the plurality of field relief elements of adjacent field relief sub-regions of the first group are arranged in a staggered pattern.

10. The semiconductor device according to claim 7, wherein the plurality of field relief elements of adjacent field relief sub-regions of the first group are arranged in a staggered pattern.

11. The semiconductor device according to claim 9, further comprising a spacing between adjacent field relief elements in a field relief sub-region of the first group; wherein the spacing is greater than or equal to a length along the circumferential direction of the field relief elements in an adjacent field relief sub-region of the first group.

12. The semiconductor device according to claim 3, wherein the JTE region has a first surface and a second surface, wherein the plurality of field relief elements and, each of the field relief rings extend at least partially inside the JTE region in the first direction between the first surface and the second surface.

13. The semiconductor device according to claim 4, wherein the JTE region has a first surface and a second surface, wherein the plurality of field relief elements and, each of the field relief rings extend at least partially inside the JTE region in the first direction between the first surface and the second surface.

14. The semiconductor device according to claim 13, wherein the plurality of field relief elements and, the field relief ring(s), extend from the first surface towards the second surface;
wherein the plurality of field relief elements and each of the field relief rings, extend in the first direction fully through the JTE region from the first surface to the second surface; and
wherein, among the first and second surface, the first surface is arranged closer to the frontside metal layer.

15. The semiconductor device according to claim 1, wherein, for at least one field relief sub-region of the first group, at least some of the field relief elements are connected using one or more interconnect elements of the second charge type,
wherein, with respect to the direction perpendicular to the circumference of the active area, a width of each of the plurality of interconnect elements in a same field relief sub-region of the first group is smaller than a width of the field relief elements of that field relief sub-region;
wherein the width of each of the plurality of interconnect elements in each of the plurality of field relief sub-regions of the first group is identical.

16. The semiconductor device according to claim 1, wherein the first charge type corresponds to an p-type doping, and wherein the second charge type corresponds to a n-type doping.

17. The semiconductor device according to claim 1, wherein the first charge type corresponds to an n-type doping, and wherein the second charge type corresponds to a p-type doping.

18. The semiconductor device according to claim 2, wherein the active area comprises a first region of the first charge type attached to or electrically connected to the frontside metal layer, and a second region of the second charge type adjacent in the first direction to the first region and attached to or electrically connected to the backside metal layer;
wherein the JTE region surrounds the first region of the active area; wherein the
frontside metal layer provides an Ohmic contact to the first region and the backside metal layer provides an Ohmic contact to the second region;
wherein the semiconductor device further comprises an intrinsically doped region in between the first region and the second region; and
wherein the first region comprises a highly doped sub-region of the first charge type having a higher dopant concentration than a remainder of the first region.

19. The semiconductor device according to claim 2 , wherein the active area comprises a first region of the second charge type attached to or electrically connected to the frontside metal layer, and a second region of the second charge type adjacent in the first direction to the first region and attached to or electrically connected to the backside metal;
wherein the JTE region surrounds the first region of the active area; wherein the
frontside metal layer provides a Schottky contact to the first region and the backside metal layer provides an Ohmic contact to the second region;
wherein the semiconductor device further comprises a third region of the first charge type arranged in between the JTE region and the first region;
wherein the frontside metal layer provides an Ohmic contact to the third region; and
wherein the third region comprises a highly doped sub-region of the first charge type having a higher dopant concentration than a remainder of the third region.

20. The semiconductor device according to claim 1, wherein the semiconductor device is based semiconductor technology selected from the group consisting of silicon', silicon carbide, gallium nitride, and gallium arsenide technology or any combination thereof;
wherein the plurality of field relief elements have a shape selected from the group consisting of a polygonal shape, a rectangular shape, an elliptical shape, and a circular shape or any combination thereof;
wherein each field relief element in a same field relief sub-region of the first group has the same shape and size; and
wherein the field relief elements of all field relief sub-regions of the first group have the same shape.

* * * * *